United States Patent
Kuroda et al.

(10) Patent No.: US 11,432,445 B2
(45) Date of Patent: Aug. 30, 2022

(54) SUBSTRATE WORKING MACHINE THAT SELECTS WHICH LIFTING AND LOWERING SECTION TO PICK UP A COMPONENT

(71) Applicant: FUJI CORPORATION, Chiryu (JP)

(72) Inventors: Hideya Kuroda, Toyota (JP); Mitsuru Sanji, Toyota (JP); Shigeto Oyama, Kariya (JP); Daisuke Yamanaka, Chiryu (JP)

(73) Assignee: FUJI CORPORATION, Chiryu (JP)

( * ) Notice: Subject to any disclaimer, the term of this patent is extended or adjusted under 35 U.S.C. 154(b) by 220 days.

(21) Appl. No.: 16/465,616

(22) PCT Filed: Dec. 2, 2016

(86) PCT No.: PCT/JP2016/085938
§ 371 (c)(1),
(2) Date: May 31, 2019

(87) PCT Pub. No.: WO2018/100737
PCT Pub. Date: Jun. 7, 2018

(65) Prior Publication Data
US 2019/0313556 A1 Oct. 10, 2019

(51) Int. Cl.
*H05K 13/04* (2006.01)

(52) U.S. Cl.
CPC ......... *H05K 13/0413* (2013.01); *H05K 13/04* (2013.01); *H05K 13/041* (2018.08); *H05K 13/0409* (2018.08); *H05K 13/0452* (2013.01)

(58) Field of Classification Search
CPC .............. H05K 13/0413; H05K 13/04; H05K 13/0409; H05K 13/041; H05K 13/0452; H05K 13/0812; H05K 13/0813
See application file for complete search history.

(56) References Cited

U.S. PATENT DOCUMENTS

2010/0223782 A1* 9/2010 Maenishi ........... H05K 13/0853
29/739
2014/0026410 A1* 1/2014 Kodama ................ H05K 3/305
29/832
(Continued)

FOREIGN PATENT DOCUMENTS

EP          3 065 522 A1     9/2016
JP       2008227402 A  *  9/2008  ............. H05K 13/04
(Continued)

OTHER PUBLICATIONS

International Search Report dated Mar. 7, 2017 in PCT/JP2016/085938 filed on Dec. 2, 2016.

*Primary Examiner* — Donghai D Nguyen
*Assistant Examiner* — Jose K Abraham
(74) *Attorney, Agent, or Firm* — Oblon, McClelland, Maier & Neustadt, L.L.P.

(57) ABSTRACT

A board work machine that includes a rotary head with multiple positions is provided for lowering nozzle holders and is able to continue operating even though it is determined that the nozzle holder cannot be lowered at one of the multiple positions. In step S1 in a Z shaft updating process, when determining based on Z shaft table that a lifting and lowering operation function is not effective and that an assigned Z shaft is not used for lifting and lowering, CPU lifts up and lowers a Z shaft that differs from the assigned Z shaft in step S11. Mounter can continue mounting work by using the Z shaft that differs from the assigned Z shaft.

9 Claims, 7 Drawing Sheets

(56) References Cited

U.S. PATENT DOCUMENTS

2017/0142875 A1\* 5/2017 Iisaka ................ H05K 13/0413
2017/0311493 A1\* 10/2017 Ito ...................... H05K 13/0408

FOREIGN PATENT DOCUMENTS

WO     WO-2013145228 A1 \* 10/2013 ......... H05K 13/0409
WO     WO 2013-190608 A1    12/2013

\* cited by examiner

| COMPONENT | TOUCHDOWN SENSOR | SIDE CAMERA |
|---|---|---|
| A | NECESSARY | NECESSARY |
| B | UNNECESSARY | UNNECESSARY |
| C | NECESSARY | UNNECESSARY |

FIG.7

| SEQUENCE | COMPONENT | OPERATION | ASSIGNMENT |
|---|---|---|---|
| 1 | A | HOLD | Z1 |
| 2 | B | HOLD | Z2 |
| 3 | C | HOLD | Z1 |
| ⋮ | ⋮ | ⋮ | ⋮ |
| n | A | MOUNT | Z1 |
| n+1 | B | MOUNT | Z2 |
| n+2 | C | MOUNT | Z1 |

| Z SHAFT | LIFTING AND LOWERING | TOUCHDOWN SENSOR | SIDE CAMERA |
|---|---|---|---|
| Z1 | OK | OK | OK |
| Z2 | OK | NG | OK |

FIG.9

SUBSTRATE WORKING MACHINE THAT SELECTS WHICH LIFTING AND LOWERING SECTION TO PICK UP A COMPONENT

TECHNICAL FIELD

The present application relates to a substrate working machine (hereinafter referred to as board work machine).

BACKGROUND ART

There have conventionally been mounters in which components supplied by a feeder are picked up by multiple suction nozzles that a head includes and are mounted on a board. Patent Literature 1 discloses a component mounter in which a revolving head includes multiple nozzle holders configured to hold a suction nozzle, and the nozzle holders can be lowered to multiple positions (stopping positions). According to this configuration, the degree of freedom can be improved in relation to positions to which the nozzle holders are lowered to pick up and release components.

PATENT LITERATURE

Patent Literature 1: WO 2013/190608

BRIEF SUMMARY

Technical Problem

In the mounter disclosed in Patent Literature 1, since there are provided the multiple positions to which the nozzle holders can be lowered, for example, an operating state such as an error in which the nozzle holder cannot be lowered properly may differ for each of the positions to which the nozzle holders can be lowered. In such as case, a component which is previously allocated to be lowered to the position to which the nozzle holder cannot be lowered cannot be mounted accordingly.

The disclosure has been made in view of such situations, and an object of the disclosure is to provide a board work machine that includes a head with multiple positions provided for lowing nozzle holders and is able to continue operating even though it is determined that the nozzle holder cannot be lowered at one of the multiple positions.

Solution to Problem

The present description discloses a board work machine including: a head configured to mount a component; multiple nozzle holders provided on the head; a suction nozzle held onto each of the multiple nozzle holders to pick up a component; multiple lifting and lowering sections configured to individually lift and lower the corresponding nozzle holders provided on the head; and a control section configured to control which lifting and lowering section of the multiple lifting and lowering sections is to be used to lower the nozzle holder when a component picked up by the suction nozzle is released in a predetermined position on a board to be mounted on the board, wherein when lowering the nozzle holder, the control section execute: a first determination process of determining whether the nozzle holder is to be lowered by a pre-assigned lifting and lowering section of the multiple lifting and lowering sections based on an operation state; and a first lowering process of lowering the nozzle holder by any one of the multiple lifting and lowering sections that differs from the pre-assigned lifting and lowering section when determining that the nozzle holder is not to be lowered by the pre-assigned lifting and lowering section in the first determination process.

Advantageous Effects

According to this disclosure, it is possible to provide a board work machine including a head having multiple positions to which a nozzle holder can be lowered, the board work machine being capable of continuing to operate even though it is determined that the nozzle holder is not to be lowered to one of the multiple positions.

DESCRIPTION OF EMBODIMENT

<Configuration of Electronic Component Mounting Device>

Figure 1:
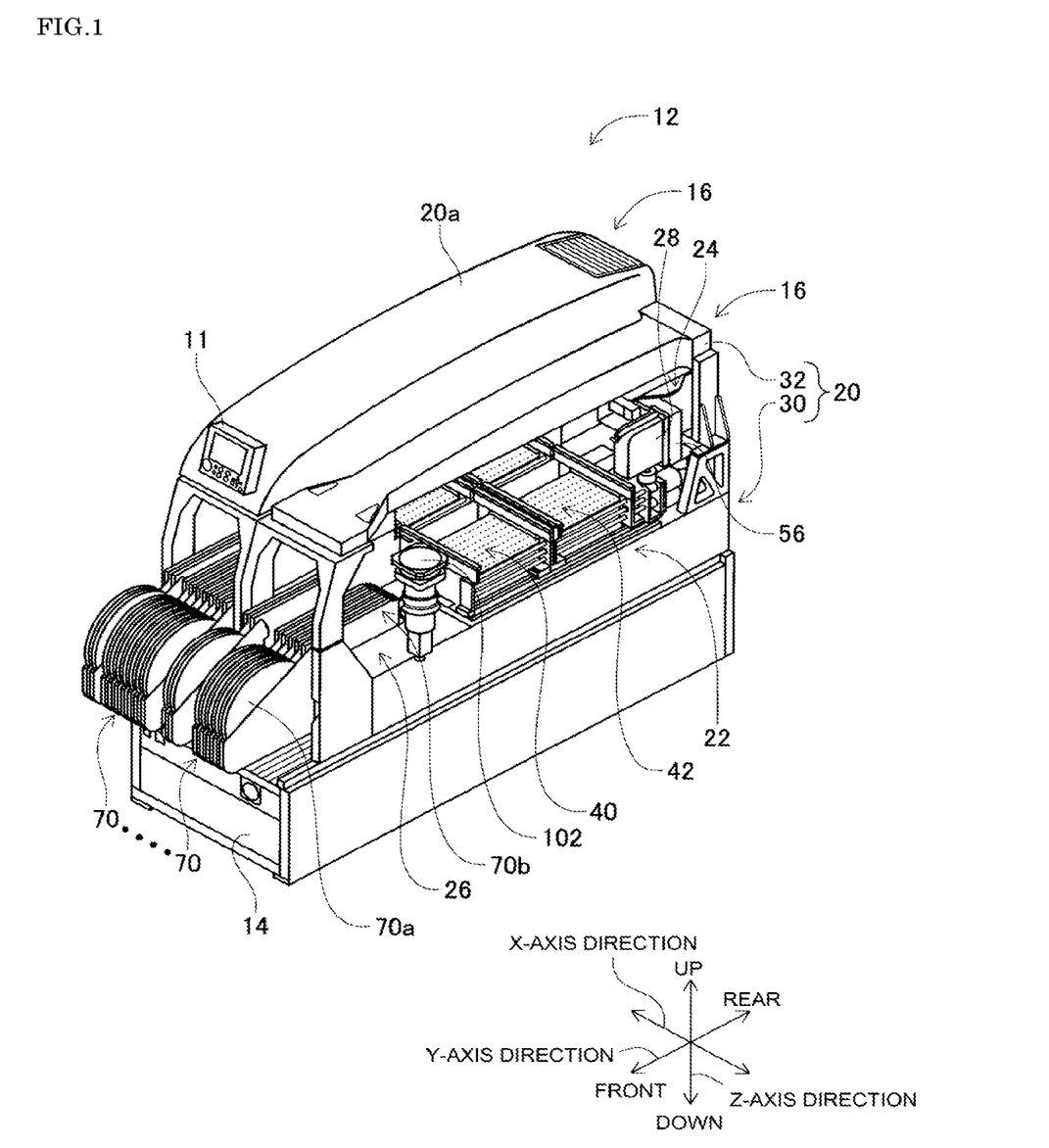
FIG. 1 is a perspective view of an electronic component mounting device according to an embodiment.

As shown in FIG. 1, electronic component mounting device (hereinafter, referred briefly to as a mounting device) 12 includes system base 14 and two mounters 16. Two mounters 16 are disposed adjacent to each other on system base 14. Mounters 16 each include mounter main body 20, conveyance device 22, mounting head moving device (hereinafter, referred briefly to as a moving device) 24, supply device 26, mounting head 28, upper cover 20a, part camera 102, and touch panel 11. Mounting device 12 performs mounting work of mounting an electronic component on, for example, a printed circuit board that is conveyed by the conveyance device 22. When directions are referred to in the following description, directions shown in FIG. 1 are used. A direction in which a board is conveyed by the conveyance device 22 is referred to as an X-axis direction, and a direction orthogonal to the X-axis direction is referred to as a Y-axis direction.

Mounter main body 20 includes frame section 30 and a beam section 32 provided to extend over frame section 30. Upper cover 20a is provided on beam section 32. Touch panel 11 is provided at a front upper portion of mounter 16 to display information on operation of mounter 16 and the like and receives an instruction from an operator. Part camera 102 is provided between conveyance device 22 and supply device 26 and images an electronic component held by mounting head 28.

Conveyance device 22 includes two conveyor devices 40 and 42 and a board holding device (FIG. 5) 48. Two conveyor devices 40 and 42 extend in an X-axis direction and are provided parallel to each other on frame section 30. Each of two conveyor devices 40 and 42 conveys a board supported on each of conveyor devices 40 and 42 in the X-axis direction by using conveyor motor (FIG. 5) 46 as a driving source. Board holding device (FIG. 5) 48 pushes and fixes a component conveyed in the manner described above in a predetermined position.

Supply device 26 is a feeder-type supply device and is provided at a front end portion of frame section 30. Supply device 26 includes multiple tape feeders 70. Tape feeders 70 each include supply reel 70a and feed device (FIG. 5) 76. A tape of electronic components taped thereto is wound around supply reel 70a. While unwinding the tape wound around the supply reel 70a, feed device 76 unseals the tape to feed out the electronic components to component supply section 70b provided at a rear end of tape feeder 70.

Figure 2:
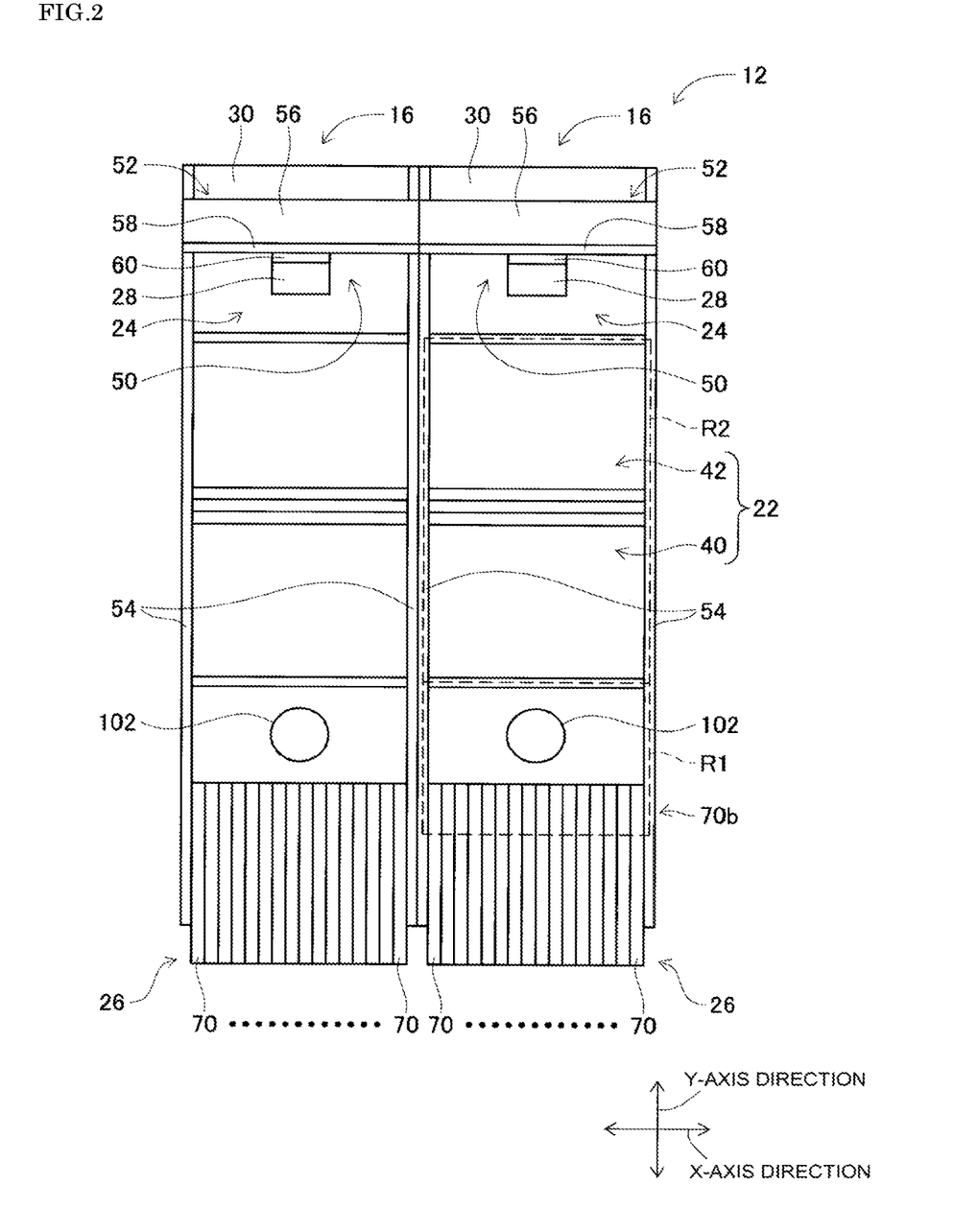
FIG. 2 is a plan view of the electronic component mounting device.

Referring to FIG. 2, moving device 24 will be described. FIG. 2 is a plan view showing mounting device 12 as viewed from above with upper covers 20a removed. Moving device 24 includes Y-axis direction slide mechanism 52, X-axis direction slide mechanism 50, and the like. Y-axis direction slide mechanism 52 includes a pair of Y-axis direction guide rails 54 extending in the Y-axis direction, Y-axis slider 56, Y-axis motor (FIG. 5) 62, and the like. Y-axis slider 56 moves to any position in the Y-axis direction by being guided by Y-axis direction guide rails 54 in response to a drive of a Y-axis motor. X-axis direction slide mechanism 50 includes X-axis direction guide rail 58 extending in the X-axis direction and X-axis slider 60. X-axis direction guide rail 58 is fixed to Y-axis slider 56, and X-axis slider 60 moves to any position in the X-axis direction by being guided by the X-axis direction guide rail 58 in response to a drive of the X-axis motor. Mounting head 28, configured to pick up an electronic component to mount it on a board, is fixed to X-axis slider 60.

Figure 3:
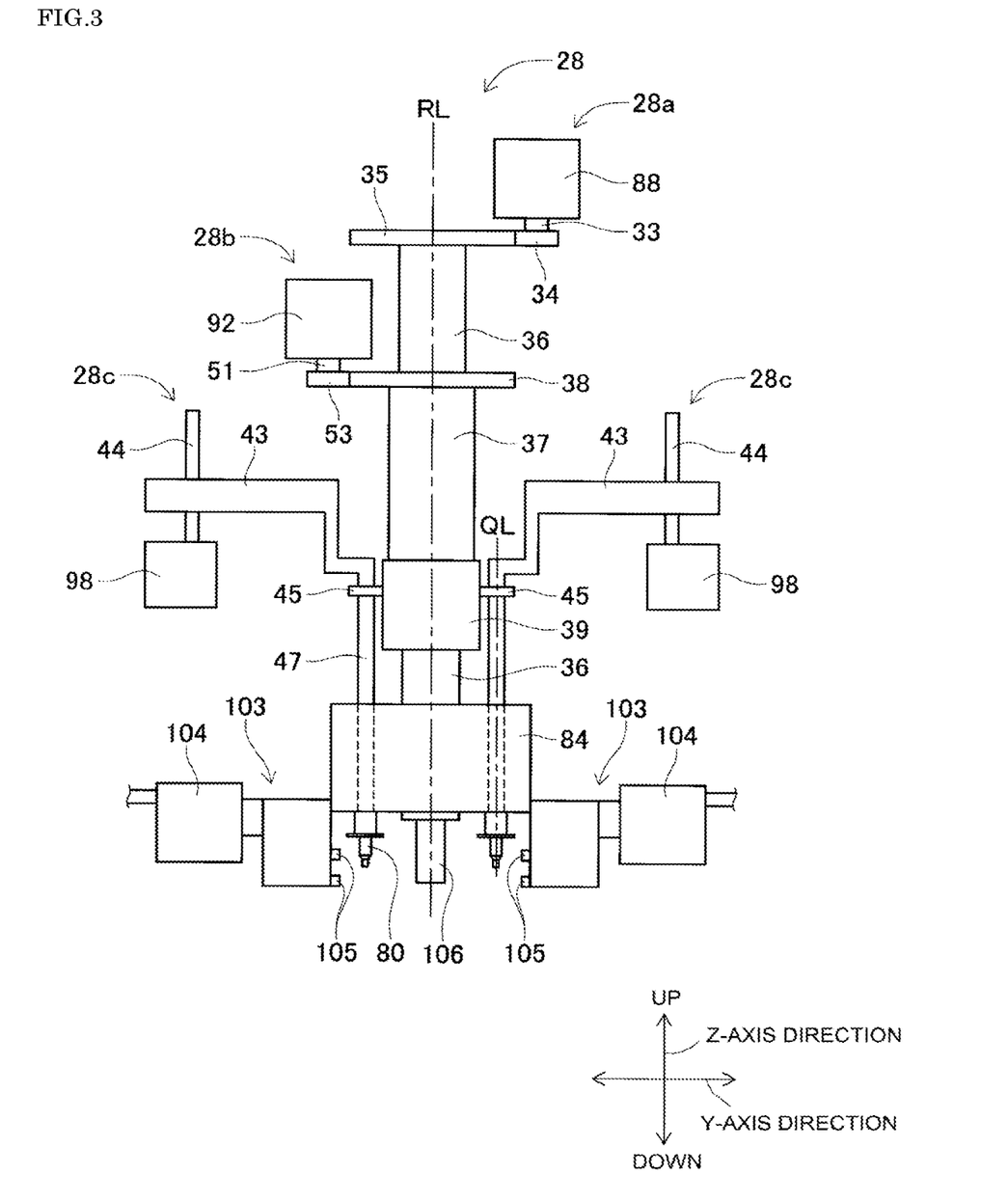
FIG. 3 is a side view of a mounting head.

Next, mounting head 28 will be described in detail by reference to FIG. 3. Mounting head 28 constitutes a rotary head including R shaft driving mechanism 28a, Q shaft driving mechanism 28b, Z shaft driving mechanisms 28c and 28c, rotary section 84, nozzle gears 45, nozzle rotation shafts 47, suction nozzles 80, imaging sections 103 and 103, and the like. In rotary section 84, eight nozzle rotation shafts 47 are held on circumference 80a that is concentric with R-axis RL constituting a center axis of rotary section 84 (refer to FIG. 4). R shaft driving mechanism 28a rotates rotary section 84 and nozzle rotation shafts 47 about R-axis RL as a rotation axis. To describe this in detail, R shaft driving mechanism 28a rotates intermittently rotary section 84 and nozzle rotation shafts 47 by an angle formed by adjacent nozzle rotation shafts 47 and R-axis RL at a time. In the following description, positions on circumference 80a where nozzle rotation shafts 47 stop will be referred to as a stopping position. Q shaft driving mechanism 28b rotates suction nozzle 80 about Q-axis QL that is a center axis of suction nozzle 80 as a rotation axis. Z shaft driving mechanism 28c lifts and lowers nozzle rotation shafts 47 individually in an up-down direction in each of two lifting and lowering positions HP1 and HP2 (FIG. 4) in eight stopping positions. In FIG. 3, in nozzle rotation shafts 47, nozzle rotation shafts other than nozzle rotation shafts 47 located in lifting and lowering positions HP1 and HP2 are omitted from illustration.

R shaft driving mechanism 28a includes R shaft motor 88, which is an electromagnetic motor, rotation shaft 33, gears 34, 35, and R shaft 36. Gear 35 is fixed to an upper end portion of R shaft 36, and cylindrical rotary section 84, which is concentric with R shaft 36, is fixed to a lower end portion of R shaft 36. Rotation shaft 33 is a rotation shaft of R shaft motor 88, and gear 34 is fixed to a lower end portion thereof. Gear 35 and gear 34 mesh with each other. As a result, a driving force of R shaft motor 88 is transmitted to R shaft 36, whereby rotary section 84 rotates about R-axis RL.

Q shaft driving mechanism 28b includes Q shaft motor 92, which is an electromagnetic motor, rotation shaft 51, gear 53, and Q shaft 37. Q shaft 37 includes gears 38 and 39. Gear 38 is fixed to an upper end portion of Q shaft 37, and gear 39 is fixed to a lower end portion of Q shaft 37. Rotation shaft 51 is a rotation shaft of Q shaft motor 92. Gear 53 and gear 38 mesh with each other. As a result, a driving force of Q shaft motor 92 is transmitted to Q shaft 37, and Q shaft 37 and gear 39 rotate about R-axis RL.

Z shaft driving mechanisms 28 each include Z shaft motor 98, which is an electromagnetic motor, ball screw 44, Z shaft lever 43, and the like. Ball screw 44 is fixed to Z shaft motor 98 and rotates about an axis parallel to R-axis RL. Z shaft lever 43 is an L-shaped member, and a nut (not shown), configured to screw on to ball screw 44, is fixed to a first end portion of Z shaft lever 43 via a nut (not shown). As a result, a rotation of Z shaft motor 98 is converted into a linear motion, and Z shaft lever 43 moves in the up-down direction by being guided by a guide rail, not shown. A second end portion of Z shaft lever 43 is in engagement with an upper end portion of nozzle gear 45. Nozzle gear 45 is fixed to an upper end portion of nozzle rotation shaft 47 and meshes with gear 39. As a result, nozzle gear 45 and nozzle rotation shaft 47 rotate about Q-axis QL as Q shaft 37 is rotated by means of the driving force of Q shaft motor 92.

Suction nozzle 80 is attached and held to a lower end portion of nozzle rotation shaft 47. A negative pressure and a positive pressure are supplied to suction nozzle 80 from positive and negative pressure supply device 82 (FIG. 5) by way of a negative pressure air passage and a positive pressure air passage, respectively, which are provided on nozzle rotation shaft 47. As a result, suction nozzle 80 can pick up and hold an electronic component by means of the negative pressure and release the held electronic component by means of the positive pressure.

Imaging section 103 includes side camera 104, LED (Light Emitting Diode) 105, reflective body 106, and the like. LED 105 emits light towards reflective body 106. Reflective body 106 has a cylindrical shape centered at R-axis RL as a center axis thereof and is fixed to a lower end portion of rotary section 84. Reflective body 106 has a high reflectance on a circumferential surface and reflects light emitted by LED 105. Side camera 104 includes, for example, a CCD image sensor, receives light reflected by reflective body 106 and captures an image of a side face of an electronic component picked up at a tip portion of suction nozzle 80. Specifically, side camera 104 captures an image of a side face before and after nozzle rotation shaft 47 is lifted up and lowered. By comparing the images captured before and after nozzle rotation shaft 47 is lifted up and lowered, whether the electronic component is mounted can be determined. That is, in the case where the image captured after nozzle rotation shaft 47 is lifted up includes the image of the electronic component, it can be determined that the electronic component is not mounted. Incidentally, in an image captured by side camera 104, a region where light in a light path from reflective body 106 to imaging section 103 is blocked by suction nozzle 80, an electronic component, and the like constitutes a dark portion.

Next, operations of mounter 16 during mounting work will be described. Boards are conveyed to a predetermined position by conveyor devices 40 and 42 and are fixed in place by board holding device 48. On the other hand, moving device 24 moves mounting head 28 to component supply section 70b of supply device 26. Rotary section 84 rotates so that nozzle rotation shaft 47 holding predetermined suction nozzle 80 is located in lifting and lowering position HP1 and HP2 (refer to FIG. 4). Nozzle rotation shaft 47 holding predetermined suction nozzle 80 is lowered to a position where an electronic component fed out to component supply section 70b is present. A negative pressure is supplied to predetermined suction nozzles 80, and predetermined suction nozzle 80 picks up and holds the electronic component. Thereafter, predetermined suction nozzle 80 is lifted up. The series of operations described above is repeated as required, whereby multiple suction nozzles 80 come to hold electronic components individually.

Next, moving device 24 moves mounting head 28 to stay above mounting positions of the boards. Q shaft motor 92 rotates so that the electronic components held by suction nozzles 80 are corrected to a predetermined posture. Predetermined nozzle rotation shafts 47 of mounting head 28 that hold the electronic components are lowered, whereby the electronic components are mounted on the boards. Then, a positive pressure is supplied to suction nozzles 80, whereby the electronic components are released from corresponding suction nozzles 80. Thereafter, predetermined suction nozzle 80 is lifted up.

Here, an advantageous effect of providing two Z shaft driving mechanisms 28c will be described by use of FIG. 4. As described above, mounting head 28 lifts up and lowers nozzle rotation shafts 47 for picking up electronic components at component supply section 70b and mounting the electronic components on boards. Here, a region where nozzle rotation shafts 47 are lifted up and lowered for picking up electronic components will be referred to as component pickup region R1, and a region where nozzle rotation shafts 47 are lifted up and lowered for mounting electronic components on boards will be referred to as component mounting region R2. As shown in FIG. 2, component pickup region R1 is a region including component supply section 70b, and component mounting region R2 is a region including conveyor devices 40 and 42.

Figure 4:
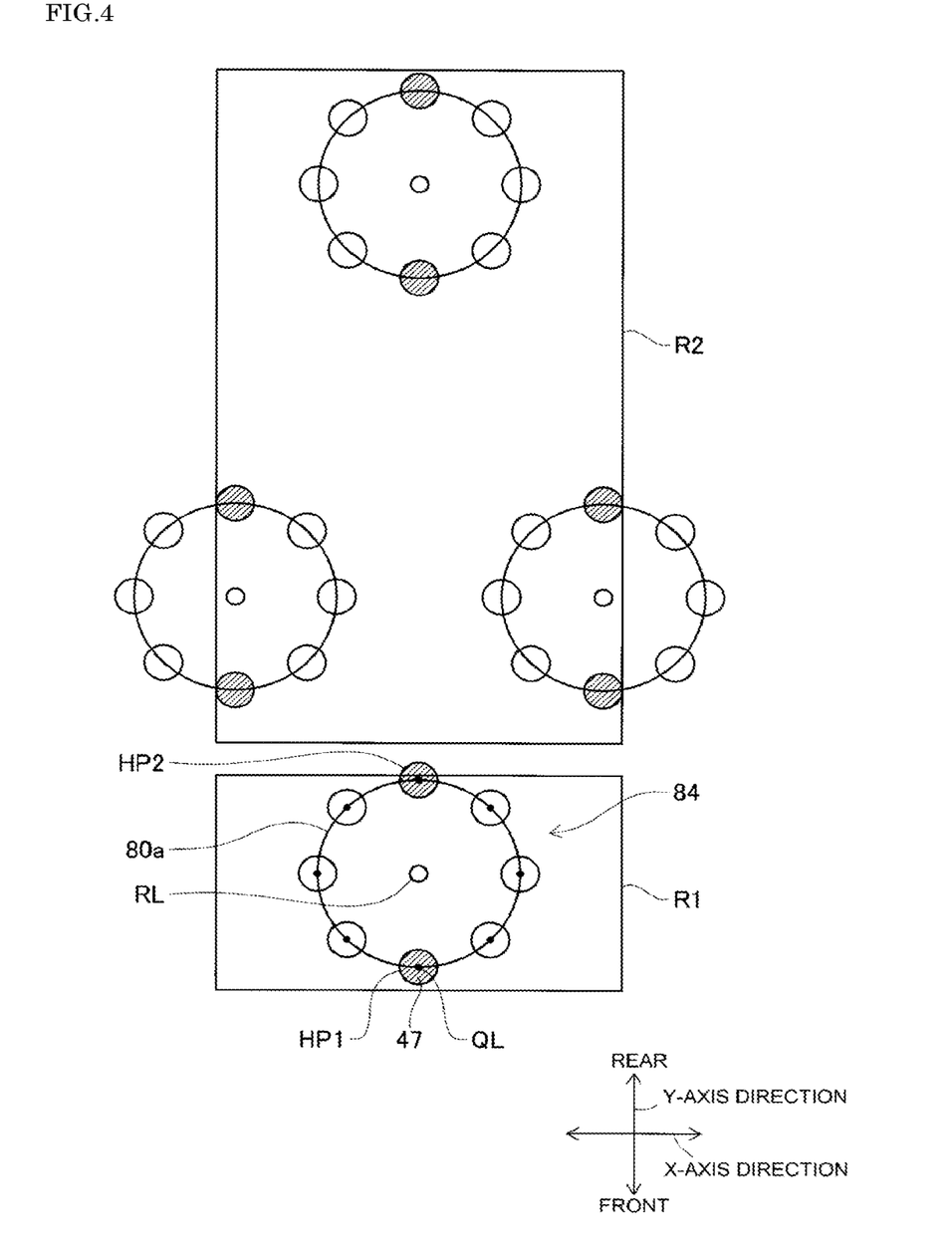
FIG. 4 is a diagram describing an operation of the mounting head.

In FIG. 4, hatched portions indicate two lifting and lowering positions HP1 and HP2 where nozzle rotation shaft 47 is lifted up and lowered. Lifting and lowering position HP1 is positioned at a front end portion of component pickup region R1 in the Y-axis direction, and lifting and lowering position HP2 is positioned at a rear end portion of lifting and lowering region R1 in the Y-axis direction. When nozzle rotation shaft 47 is lifted up and lowered at the front end portion of component pickup region R1, lifting and lowering position HP1 at the front end portion is used, whereas when nozzle rotation shaft 47 is lifted up and lowered at the rear end portion of component mounting region R2, lifting and lowering position HP2 at the rear end portion is used. As a result, compared with a case where there is only one lifting and lowering position, a moving range for mounting head 28 can be reduced. In the following description, Z shaft driving mechanism 28c will be referred to as a Z shaft, Z shaft driving mechanism 28c corresponding to lifting and lowering position HP1 as a Z1 shaft, and Z shaft driving mechanism 28c corresponding to lifting and lowering position HP2 as a Z2 shaft.

Control System Configuration of Electronic Component Mounting Device

Figure 5:
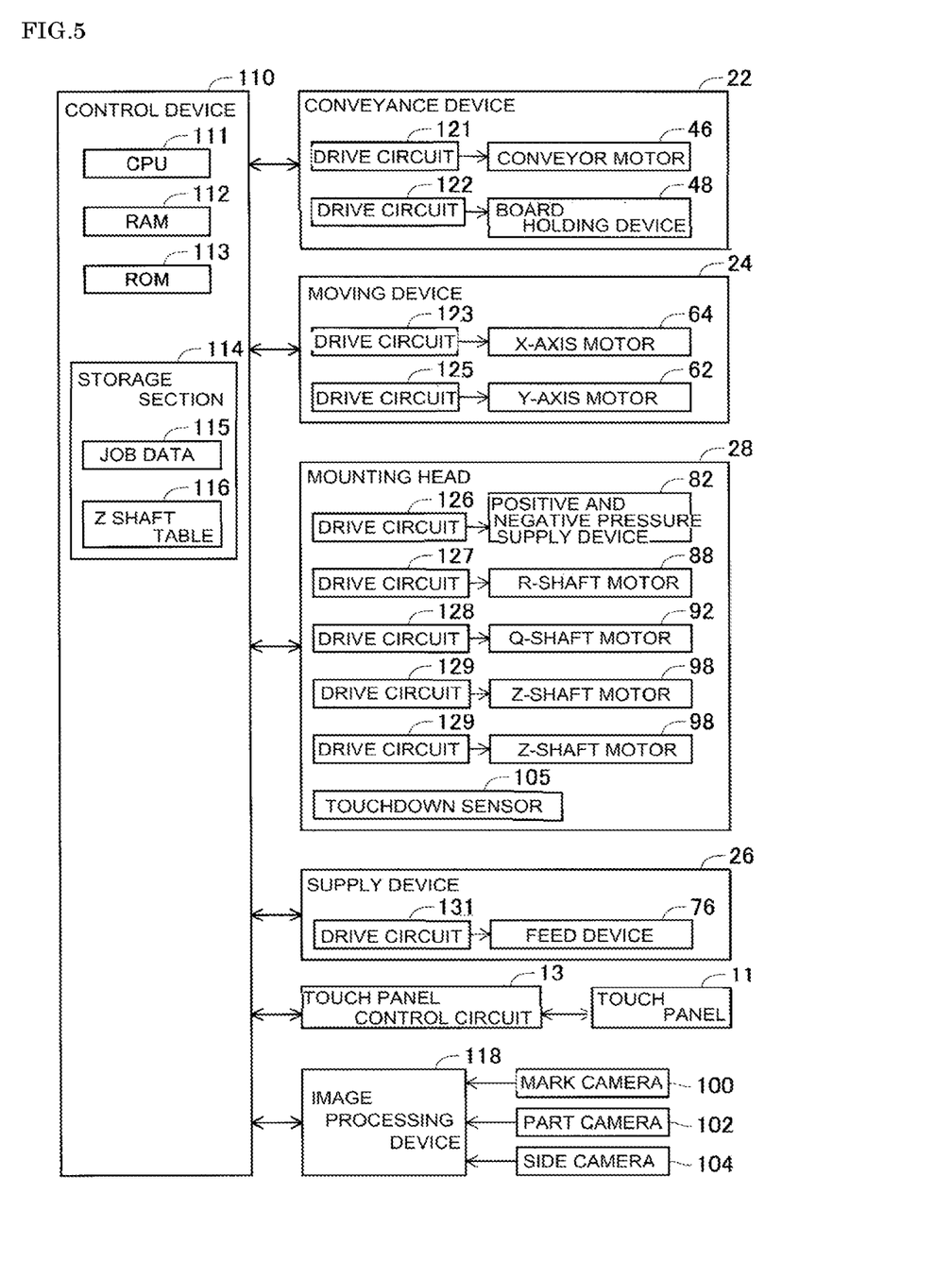
FIG. 5 is a diagram describing a control configuration of an electronic component mounting devices.

The configuration of a control system for mounter 16 will be described by use of FIG. 5. Mounter 16 includes, in addition to the configuration described above, control device 110, touch panel control circuit 13, image processing device 118, mark camera 100, and the like. Control device 110 includes CPU 111, RAM 112, ROM 113, memory section 114, and the like. CPU 111 controls electrically connected sections by executing various types of programs stored in ROM 113. Here, the electrically connected sections denote conveyance device 22, moving device 24, mounting head 28, supply device 26, touch panel control circuit 13, image processing device 118, and the like. Specifically, CPU 111 issues commands to the sections, and when operations instructed by the commands are completed at the sections, the sections each output a signal indicating that the operation is completed to CPU 111. When the operations cannot be completed due to an error or the like at the sections, the sections each output an error signal to CPU 111. As a result, while confirming that the operations at the sections are completed, CPU 111 can control the sections one by one in accordance with sequence data (which will be described later). RAM 112 is used as a main storage device for CPU 111 to execute various types of processes. ROM 113 stores a program for a Z shaft changing process (which will be described later), a control program, various types of data, and the like. Memory section 114 is realized by, for example, a flash memory, and job data 115, Z shaft table 116, various types of pieces of information, and the like are recorded in memory section 114.

In addition to the configurations described above, conveyance device 22 includes drive circuit 121 configured to drive conveyor motor 46, a drive circuit 122 configured to drive board holding device 48, and the like. In addition to the configurations described above, moving device 24 includes a drive circuit 123 configured to drive X-axis motor 64, a drive circuit 125 configured to drive Y-axis motor 62, and the like.

In addition to the configurations described above, mounting head 28 includes drive circuit 126 configured to drive positive and negative pressure supply device 82, drive circuit 127 configured to drive R shaft motor 88, drive circuit 128 configured to drive Q shaft motor 92, drive circuits 129 and 129 configured to drive Z shaft motors 98, touchdown sensor 105, and the like. Positive and negative pressure supply device 82 includes a measuring instrument (not shown) configured to measure a pressure to be supplied, and drive circuit 126 controls positive and negative pressure supply device 82 according to a value indicated by the measuring instrument. In the case where the value of the measuring instrument changes beyond a reference range while suction nozzle 80 is picking up an electronic component, drive circuit 126 determines that an error is occurring and outputs an error signal to CPU 111. Drive circuits 129 are individually provided on Z shaft motors 98 and 98. As a result, Z shaft driving mechanisms 28c can lift up and lower nozzle rotation shafts 47 individually. An encoder (not shown) is attached to each of R shaft motor 88, Q shaft motor 92 and Z shaft motors 98, and the drive circuits configured to drive R shaft motor 88, Q shaft motor 92 and Z shaft motors 98 control rotations of R shaft motor 88, Q shaft motor 92 and Z shaft motors 98 based on signals from the encoders attached thereto. When the drive circuits acquire, from an encoder, information informing that the position of nozzle rotation shaft 47 remains unchanged, that is, the nozzle rotation shaft 47 cannot be lifted up or lowered even though the drive circuits output a driving current to the corresponding motors, the drive circuits determine that an error is occurring and output an error signal to CPU 111. Touchdown sensor 105 is attached to nozzle rotation shaft 47 and outputs to CPU 111 a signal corresponding to a push-in amount indicating a magnitude of a force that nozzle rotation shaft 47 applies downwards, for example, after an electronic component picked up by suction nozzle 80 is brought into contact with a board.

In addition to the configurations described above, supply device 26 includes drive circuit 131 configured to drive feed device 76 and the like. Touch panel control circuit 13 displays an image corresponding to a command from CPU 111 on touch panel 11 and outputs information received by touch panel 11 to CPU 111 in the form of a signal. Mark camera 100 is fixed to a lower face of X-axis slider 60 while being directed downwards and images, for example, a board positioning reference mark formed on a board. Image processing device 118 is realized by, for example, a computer and image processes image data imaged by mark camera 100, part camera 102 and side cameras 104. Specifically, image processing device 118 digitizes a position of an outer shape of, for example, an electronic component included in image data and outputs digitized data to CPU 111. CPU 111 compares verification data (which will be described later) with data in which the image is digitized and determines whether work is performed as designed. As described above, part camera 102 captures a two-dimensional image of an electronic component or the like in an XY-plane. Side camera 104 capture a two-dimensional image of an electronic component or the like in a YZ plane. For example, CPU 111 determines whether the position of an electronic component picked up by suction nozzle 80 in the XY-plane remains within a normal range based on an image captured by part camera 102. In addition, CPU 111 determines whether the position of an electronic component picked up by suction nozzle 80 in the YZ-plane remains within a normal range based on an image captured by side camera 104.

Figure 6:
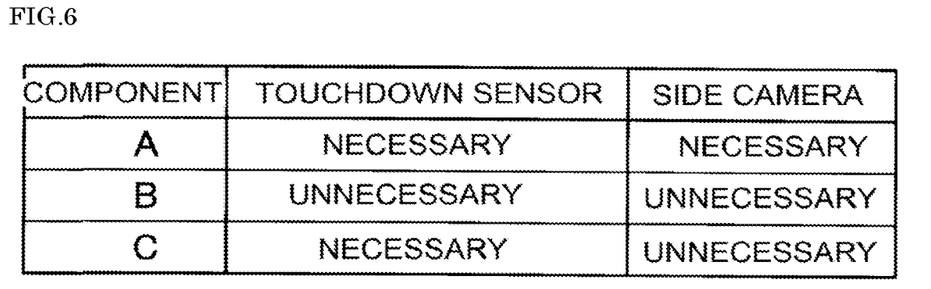
FIG. 6 is a table describing part data.
Figure 7:
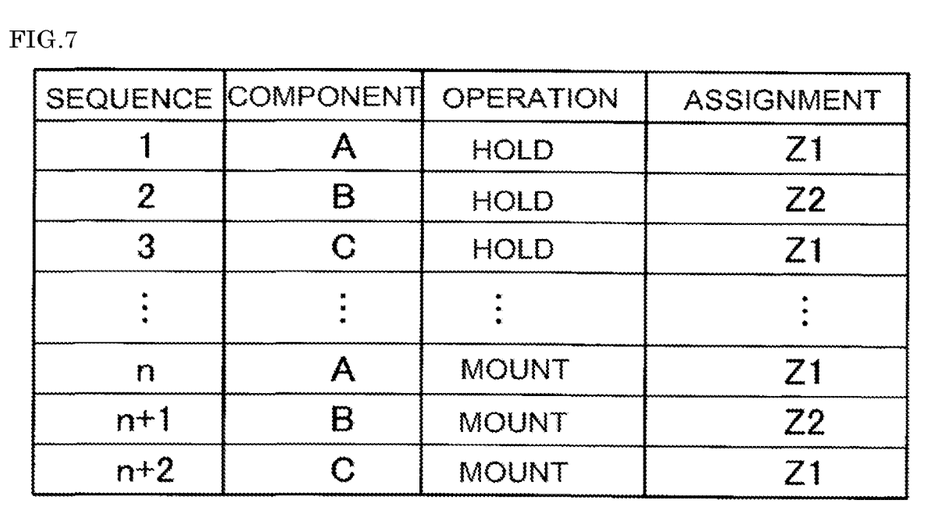
FIG. 7 is a table describing sequence data.

Next, job data 115 will be described. Job data 115 includes part data, sequence data, verification data, and the like. The part data is data in which pieces of information on components to be mounted on boards are collected and organized for each component. The pieces of information on components include not only external dimensions of components but also information on whether the use of touchdown sensor 105 is necessary or unnecessary and information on whether a collation using side camera 104 is necessary or unnecessary, which are illustrated in FIG. 6. The sequence data is data in which operations performed by the sections are arranged according to a sequence in which the operations are performed by the sections as illustrated in FIG. 7. In FIG. 7, "Sequence" is an item denoting the order of operations, and numbers are assigned as values to the item. "Part" is an item designating components, and identifiers given in advance to components are assigned as values to the item. "Operation" is an item designating operations performed by mounting head 28, and "Hold" and "Mount" are assigned to the item. Here, "Hold" denotes an operation in which suction nozzle 80 is caused to hold an electronic component, and "Mount" denotes an operation in which the electronic component is released from suction nozzle 80, so that the electronic component is mounted on a board. "Assignment" is an item specifying which of the Z1 shaft and the Z2 shaft is to be used. "Z1" denoting the Z1 shaft and "Z2" denoting the Z2 shaft are assigned as values to the item. In FIG. 7, although not illustrated therein, when the value of the operation is "Hold", positional coordinates on component supply section 70*b* where nozzle rotation shaft 47 is lifted up and lowered are included, and when the value of the operation is "Mount", positional coordinates on a board where an electronic component is mounted, that is, nozzle rotation shaft 47 is lowered and lifted up are included. The verification data is data for use for mounting device 12 to work as designed. For example, the verification data includes data on positions and shapes of electronic components.

Z Shaft Changing Process

Figure 8:
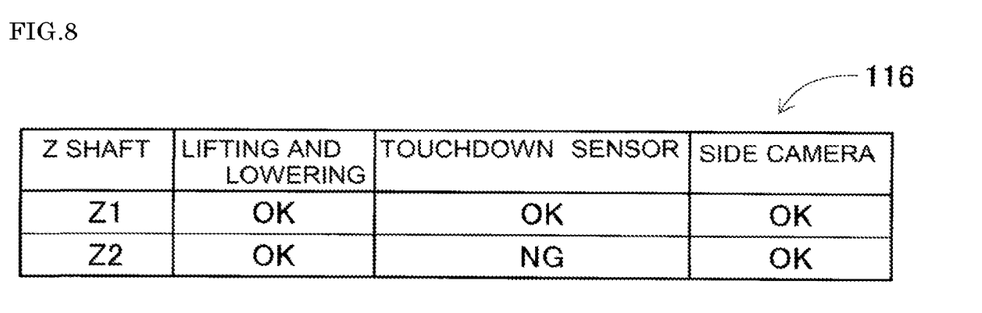
FIG. 8 is a Z shaft table showing OK and NG for each of functions of Z shafts.

CPU 111 reads out job data 115 and issues commands one by one to the sections according to the "sequence" of the sequence data. As a result, mounter 16 starts mounting operations. Here, when determining that the value of "Operation" in the sequence data is "Mount", CPU 111 starts a Z shaft changing process shown in FIG. 9. In the Z shaft changing process, CPU 111 uses Z shaft table 116 shown in FIG. 8. Z shaft table 116 is a table showing whether a lifting and lowering operation function which is a function that the Z1 shaft and the Z2 shaft have, a detecting function performed by touchdown sensor 105 and an imaging function performed by side cameras 104 are effective for each of the Z1 shaft and the Z2 shaft. "Lifting and Lowering" in FIG. 8 is an item denoting whether the lifting and lowering operation function is effective. "Touchdown Sensor" is an item denoting whether the detecting function by touchdown sensor 105 is effective. "Side Camera" is an item indicating whether the imaging function by side cameras 104 is effective. "OK" denoting that the function is effective and "NG" denoting that the function is not effective constitute respective values of the items.

CPU 111 determines whether the individual functions are effective and executes an updating process of updating Z shaft table 116 according to the results of the determination. Upon completion of the determination on whether the individual functions are effective, CPU 111 starts the updating process. In the updating process, when CPU 111 determines that the functions are effective, the values of the corresponding items are updated to "OK", whereas when CPU 111 determines that the functions are not effective, the values of the corresponding items are updated to "NG", and Z shaft table 116 is updated completely, CPU 111 ends the updating process.

In the following cases, CPU 111 determines whether the individual functions are effective. CPU 111 starts measuring an amount of time taken from a point in time when CPU 111 outputs a lowering and raising command to drive circuit 129 configured to drive Z shaft motor 98 configured to drive nozzle rotation shaft 47, ends measuring the amount of time when a signal indicating that the command is completed is inputted, and determines whether the lifting and lowering operation function is effective. CPU 111 determines that the lifting and lowering operation function is not effective when the measured amount of time is equal to or greater than a reference value stored in ROM 113, whereas CPU determines that the lifting and lowering operation function is effective when the measured amount of time is not equal to or less than the reference value. That is, when the amount of time taken in lowering and lifting up nozzle rotation shaft 47 is equal to or greater than the reference value, CPU 111 determines that the lifting and lowering operation function is not effective. CPU 111 determines whether the detecting function performed by touchdown sensor 105 is effective after a predetermined amount of time has elapsed from a point in time when CPU 111 orders touchdown sensor 105 to output a signal corresponding to a push-in amount. CPU 111 determines that the detecting function by touchdown sensor 105 is not effective when no signal is outputted from touchdown sensor 105, whereas CPU 111 determines that the detecting function by touchdown sensor 105 is effective when a signal is outputted from touchdown sensor 105. CPU 111 determines that an electronic component is mounted on a board properly when the push-in amount based on the signal outputted from touchdown sensor 105 reaches a predetermined amount. CPU 111 determines whether the imaging function performed by side camera 104 is effective after a predetermined amount of time has elapsed from a point in time when CPU 111 orders image processing device 118 to output data based on an image captured by side camera 104. CPU 111 determines that the imaging function by side camera 104 is not effective when no signal is outputted from image processing device 118, whereas CPU 111 determines that the imaging function by side camera 104 is effective when a signal is outputted from image processing device 118. Image processing device 118 cannot digitize an image captured by side camera 104 unless overall brightness of the captured image is bright enough to identify an electronic component, whereby image processing device 118 cannot output data based on the image. That is, when the overall brightness of the image captured by side camera 104 is less than a reference value, CPU 111 determines that the imaging function by side camera 104 is not effective.

Figure 9:
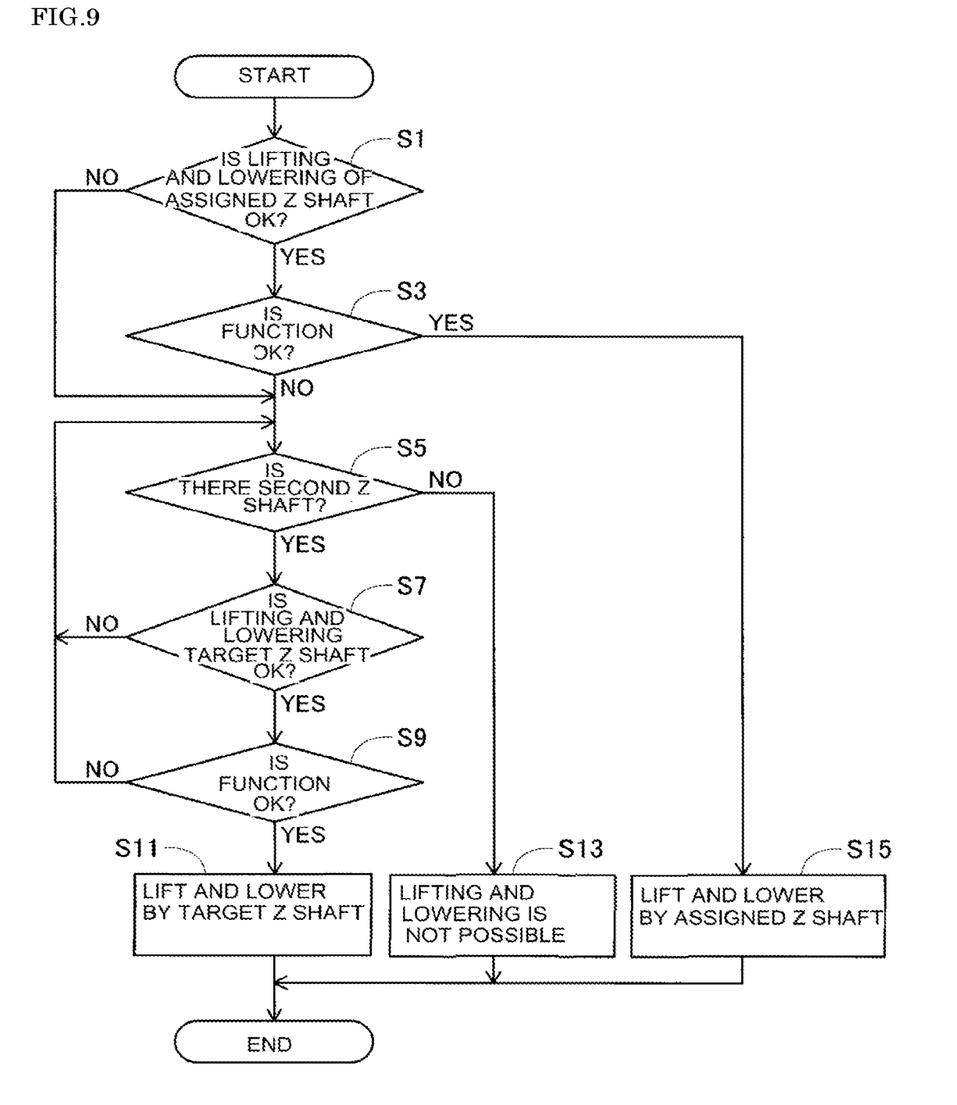
FIG. 9 is a flowchart showing processing details of a Z shaft changing process.

Next, the Z shaft updating process will be described by use of FIG. 9. Firstly, CPU 111 determines whether an assigned Z shaft can be lifted and lowered (S1). Here, the assigned Z shaft means the Z1 shaft or the Z2 shaft that constitutes the value of "Assignment" in the sequence data. CPU 111 refers to Z shaft table 116 regarding the assigned Z shaft and determines that the assigned shaft can be lifted up and lowered when the value of "Lifting and Lowering" is "OK", whereas CPU 111 determines that the assigned shaft cannot be lifted up and lowered when the value of "lifting and lowering" is "NG". When determining that the assigned Z shaft can be lifted up and lowered (S1: YES), CPU 111 determines whether the functions of the assigned Z shaft are effective (S3). Specifically, referring to the part data, CPU 111 determines whether a target component requires the detecting function by touchdown sensor 105 and the imaging function by side camera 104, and when it determines that the target component requires those functions, referring to Z shaft table 116, CPU 111 determines whether the required functions are "OK". When determining that the target component requires neither the detecting function by touchdown sensor 105 nor the imaging function by side camera 104 and that all the required functions are "OK", CPU 111 determines that the functions of the assigned Z shaft are effective. On the other hand, when determining that all the required functions are not "OK", CPU 111 determines that the functions of the assigned Z shaft are not effective. When determining that the functions of the assigned Z shaft are effective (S3: YES), CPU 111 determines that the assigned Z shaft is used for lifting and lowering (S15), then, causes RAM 112 to store the results of the determination therein, and ends the process.

On the other hand, when determining that the functions of the assigned Z shaft are not effective (S3: NO), CPU 111 determines whether there is a second Z shaft (S5). Since there are two Z shafts, CPU 111 determines that there is a second Z shaft in the determination made in step S5 which is a first determination since the start of the Z shaft changing process. When determining that there is a second Z shaft (S5: YES), CPU 111 determines whether the second Z shaft, which constitutes now a target Z shaft, can be lifted up and lowered in a similar manner to Step S1 (S7). When determining that the target Z shaft can be lifted up and lowered (S7: YES), CPU 111 determines whether functions of the target Z shaft are effective in a similar manner to Step S3 (S9). When determining that the functions of the target Z shaft are effective (S9: YES), CPU 111 determines that the target Z shaft is used for lifting and lowering (S11), then, causes RAM 112 to store the results of the determination therein, and ends the process.

On the other hand, when determining that the garget Z shaft cannot be lifted up and lowered (S7: NO) and that the functions of the target Z shaft are not effective (S9: NO), CPU 111 returns to step S5. Since there are only two Z shafts, in a determination in step S5 which constitutes a second determination since the start of the Z shaft changing process, CPU 111 determines that there is no other Z shaft (S5: NO), then, determines that the Z shaft cannot be lifted up and lowered (S13) and causes RAM 112 to store the results of the determination therein, ending the process. Upon completion of the Z shaft changing process, CPU 111 issues a command to drive circuit 129 according to the results of the determination made in the Z shaft changing process and stored in RAM 112. When determining that the assigned Z shaft is used for lifting and lowering (S15), CPU 111 issues a command to drive circuit 129 for the Z shaft that is identical to the sequence data, causing drive circuit 129 to effect required lifting and lowering. When determining that the target Z shaft is used for lifting and lowering (S11), CPU 111 issues a command to drive circuit 129 for the Z shaft that is different from the sequence data, causing drive circuit 129 to effect required lifting and lowering. When determining that both the first and second Z shafts cannot be lifted up and lowered (S13), CPU 111 issues a command to touch panel control circuit 13 to display a message reading that no mounting operation is available on touch panel 11. As described above, by executing the Z shaft changing process, even when the assigned Z shaft is determined not to be lifted up and lowered, mounter 16 can continue the mounting operation using the second Z shaft. In the case where the Z shaft changing process is not executed and the assigned Z shaft is determined not to be lifted up and lowered, the current mounting head 28 needs to be exchanged for mounting head 28 that is free from failure. In this case, mounter 16 has to stop the mounting operation. However, mounter 16 can continue the mounting operation by executing the Z shaft changing process, thereby making it possible to suppress a reduction in productivity of mounter 16.

Here, mounting device 12 constitutes an example of a board work machine, mounting head 28 constitutes an example of a rotary head, nozzle rotation shaft 47 constitutes an example of a nozzle holder, suction nozzle 80 constitutes an example of a suction nozzle, Z shaft driving mechanism 28c constitutes an example of a lifting and lowering section, and control device 110 constitutes an example of a control section. Additionally, Z shaft table 116 constitutes an example of an operation state, step S1 constitutes an example of a first determination process, and step S11 constitutes an example of a first lowering process. Further, the process where CPU 111 determines whether the lifting and lowering operation function is effective constitutes an example of a first determination section.

The detecting function by touchdown sensor 105 and the imaging function by side camera 104 constitute an example of a function section. Z shaft table 116 constitutes an example of a functional state, the part data constitutes an example of component information, step S3 constitutes an example of a second determination process, and step S11 constitutes an example of a second lowering process. Side camera 104 constitutes an example of a side face imaging camera, and touchdown sensor 105 constitutes an example of a touchdown sensor. Furthermore, the process where CPU 111 determines whether the detecting function by touchdown sensor 105 and the imaging function by side camera 104 are effective constitutes an example of a second determination section.

Thus, according to the embodiment that has been described heretofore, the following advantageous effects are provided. Even though CPU 111 determines in step S1 in the Z shaft updating process that the lifting and lowering operation function is not effective and hence that the assigned Z shaft, which is the Z shaft assigned in advance, is not used for lifting and lowering based on Z shaft table 116 (S1: NO), since the Z shaft differing from the assigned Z shaft can be lifted up and lowered in step S11 by executing the Z shaft updating process, the mounting operation can continue.

CPU 111 determines whether the individual functions of the Z shaft are effective and executes the updating process of updating Z shaft table 116 according to the results of the determination. This enables CPU 111 to determine, based on the determination result, which Z shaft is to be used for lifting and lowering without involvement of an operator.

Even though CPU 111 determines in step S3 in the Z shaft updating process that the functions other than the lifting and lowering operation function of the assigned Z shaft are not effective and hence that the assigned Z shaft is not used for lifting and lowering based on Z shaft table 116 (S3: NO), since the Z shaft differing from the assigned Z shaft can be used to lifting and lowering in step S11 by executing the Z shaft updating process, the mounting operation can continue.

Another Example of Starting Conditions for Updating Process

In the description that has been made heretofore, CPU 111 is described as determining whether the individual functions are effective and starting the updating process upon completion of the determination. However, the configuration is not limited thereto, and hence, a configuration may be adopted in which the completion of the determination does not constitute the starting conditions. The configuration will be describe below.

When determining that the individual functions are not effective, CPU 111 issues a command to touch panel control circuit 13 to display a message reading that the functions determined not to be effective are not effective on touch panel 11. As a result, the message is displayed on touch panel 11 to the operator. Then, the operator can be informed that the functions are not effective. Thereafter, CPU 111 issues a command to touch panel control circuit 13 to display a button triggering a display of Z shaft table 116 on touch panel 11. As a result, the button triggering a display of Z shaft table 116 is displayed on touch panel 11. When the button triggering a display of Z shaft table 116 is operated, touch panel control circuit 13 displays Z shaft table 116 on touch panel 11. "OK" or "NG" can be inputted into Z shaft table 116 displayed here as a value, and when "OK" or "NG" is inputted, touch panel control circuit 13 outputs a signal indicating the input of "OK" or "NG" to CPU 111. As a result, CPU 111 updates Z shaft table 116 stored in storage section 114 based on the signal.

When being notified of the message denoting that the functions are not effective, the operator may be able to resolve the drawback without any delay to restore the functions. Then, according to this configuration, when desiring to perform the mounting operation according to the sequence data, the operator can also input "OK" into Z shaft table 116 after resolving the drawback. Alternatively, the operator can also input "NG" into Z shaft table 116 so as to continue the mounting operation using the Z shaft differing from the Z shaft specified in the sequence data.

Here, the process where CPU 111 determines whether the lifting and lowering operation function is effective constitutes an example of a first determination section. The process where CPU 111 determines whether the detecting function by touchdown sensor 105 and the imaging function by side camera 104 are effective constitutes an example of a second determination section. Touch panel 11 constitutes an example of a notification section.

Thus, according to the other updating process starting conditions described above, the following advantageous effect is provided. When CPU 111 determines that the individual functions are not effective, determining on the situations then, the operator can input the desired value into Z shaft table 116.

Another Example of Criteria for Determination on Effectiveness of Functions

Although CPU 111 is described as determining whether the individual functions are effective based on the criteria set for the individual functions, CPU 111 can determine whether the functions are effective using other criteria other than those used above. For example, CPU 111 can determine that the lifting and lowering operation function is not effective when the Z shaft operates no lifting and lowering operation even though CPU 111 issues a command to drive circuit 129 to drive Z shaft motor 98 to lower and lift up the Z shaft. Drive circuit 129 outputs an error signal when the Z shaft operates no lifting and lowering operation. In the case where drive circuit 126 outputs an error signal indicating that should be outputted when the value of the measuring instrument changes beyond the reference range while suction nozzle 80 is picking up an electronic component, CPU 111 can determined that the lifting and lowering operation function is not effective when the number of times of outputting the error signal reaches or exceeds a reference value. This case applies to a case where suction nozzle 80 fails to keep holding the electronic component and hence drops the electronic component, or the like. Additionally, CPU 111 can determine that the lifting and lowering operation function is not effective when the number of times CPU 111 determines that no electronic component is mounted based an image captured by side camera 104 reaches or exceeds a reference value. This case is such that suction nozzle 80 fails to release an electronic component, whereby suction nozzle 80 has to be lifted up with the electronic component still held thereto.

Further, CPU 111 can determine that the lifting and lowering operation function is not effective when the number of times CPU 111 determines that the suction position where an electronic component is picked up by suction nozzle 80 is not within a normal range, based on an image captured by part camera 102 or side camera 104, reaches or exceeds a reference value. This case applies to a case where the suction position is abnormal or a case where the electronic component picked up by suction nozzle 80 is deformed. Furthermore, since an image captured by part camera 102 or side camera 104 can be displayed on touch panel 11 in mounting device 12, CPU 111 can determined that the detecting function by touchdown sensor 105 is not effective when the brightness of the image captured by part camera 102 or side camera 104 is out of a specified range.

The present disclosure is not limited to the embodiment that has been described heretofore, and needless to say, various improvements and modifications can be made thereto without departing from the spirit and scope of the disclosure. For example, although mounter 16 is described as including the two Z shaft driving mechanisms 28c, the number of Z shaft driving mechanisms 28c is not limited thereto, and hence, a configuration may be adopted in which mounter 16 includes three or more Z shaft driving mechanisms 28c.

Additionally, although mounter 16 includes the two side cameras 104, a configuration may be adopted in which mounter 16 includes one side camera 104 and the two Z shafts are imaged by the one side camera 104.

In the embodiment described above, lifting and lowering position HP1 and lifting and lowering position HP2 are described as being arranged side by side in the Y-axis direction (refer to FIGS. 3, 4), the disclosure is not limited thereto, and hence, a configuration may be adopted in which lifting and lowering position HP1 and lifting and lowering position HP2 are positioned left and right in the X-axis direction. With mounting head 28 configured in the way described above, electronic components can be picked up simultaneously in the two lifting and lowering positions of lifting and lowering position HP1 and lifting and lowering position HP2 from multiple tape feeders 70 arranged side by side in the X-axis direction in component supply section 70b. As a result, the pickup time of electronic components can be reduced.

In the embodiment described above, although mounting head 28, which is a rotary head that can rotate about the axis, is exemplified as the head, the head is not limited to the rotary head. For example, a configuration may be adopted in which multiple nozzle holders are provided fixedly on a mounting head in such a manner as to be aligned side by side in the X-axis direction or the Y-axis direction, and multiple lifting and lowering sections are provided in such a manner as to correspond individually the multiple nozzle holders. In this case, when the lifting and lowering section corresponding to any one of the multiple nozzle holders is determined not to be lowered, the setting should be changed so that an electronic component that is to be picked by a nozzle held to the nozzle holder concerned is picked up by a nozzle held by another nozzle holder.

REFERENCE SIGNS LIST

11 Touch Panel, 12 Electronic Component Mounting Device, 16 Mounter, 28 Mounting Head, 28c Z shaft Driving Mechanism, 47 Nozzle Rotation Shaft, 80 Suction Nozzle, 104 Side Camera, 105 Touchdown Sensor, 110 Control Device, 111 CPU, 116 Z shaft Table

The invention claimed is:

1. A board work machine comprising:
   a head configured to mount a component;
   multiple nozzle holders provided on the head and rotatable around an axis of the head;
   a suction nozzle held onto each of the multiple nozzle holders to pick up a component;
   multiple lifting and lowering sections, each configured to individually lift and lower a nozzle rotation shaft of one of the nozzle holders provided on the head; and
   processing circuitry configured to determine which lifting and lowering section of the multiple lifting and lowering sections is to be used to lower a nozzle holder of the multiple nozzle holders when a component picked up by the suction nozzle is mounted in a predetermined position on a board,
   wherein the processing circuitry executes:
   a first determination process of determining, for each component, whether the nozzle holder is to be lowered by a pre-assigned lifting and lowering section of the multiple lifting and lowering sections based on an operation state of the pre-assigned lifting and lowering section stored in a memory, the first determination process including a determination of whether the nozzle rotation shaft of the nozzle holder is operable by executing a lifting and lowering operation function and comparing a measured movement time of the nozzle rotation shaft against a predetermined movement time stored in the memory and performs a component mounting operation; and
   a first lowering process of lowering the nozzle holder by any one of the multiple lifting and lowering sections that differs from the pre-assigned lifting and lowering section and performs the component mounting operation when determining that the nozzle holder is not to be lowered by the pre-assigned lifting and lowering section in the first determination process.

2. The board work machine according to claim 1, wherein the head is a rotary head configured to rotate about the axis, and
   wherein the multiple lifting and lowering sections are provided to individually match multiple lifting and lowering positions on a circumference of the rotary head, the circumference being centered at the axis of the rotary head.

3. The board work machine according to claim 1, wherein the processing circuitry executes:
   in the first determination process, determining whether the multiple lifting and lowering sections are in an operation state where the multiple lifting and lowering sections can individually be lowered;
   a notification process, when the first determination process determines that the multiple lifting and lowering sections are in an operation state where the multiple lifting and lowering sections cannot be lowered, to notify that the multiple lifting and lowering sections are in the operation state where the multiple lifting and lowering sections cannot be lowered; and
   a reception process to receive an input of the operation state after the operation state of the multiple lifting and lowering sections is notified.

4. The board work machine according to claim 1, wherein the processing circuitry executes:
   in the first determination process, determining whether the multiple lifting and lowering sections are in an operation state where the multiple lifting and lowering sections can individually be lowered, and
   updating the operation state based on the operation state determined by the first determination process.

5. The board work machine according to claim 1, comprising:
   multiple functioning sections provided to individually match the multiple lifting and lowering sections to enable the suction nozzle to mount components on a board, the multiple function sections including an output of a touchdown sensor or an output of a side face imaging camera, wherein,
   when the processing circuitry determines in the first determination process that the nozzle holder is to be lowered by the pre-assigned lifting and lowering section, the processing circuitry executes
   a second determination process of determining for each component whether the nozzle holder is to be lowered by the pre-assigned lifting and lowering section of the multiple lifting and lowering sections based on a function state denoting whether in the multiple functioning sections, any one of the multiple functioning sections that matches the pre-assigned lifting and lowering section functions and predetermined component information that determines in advance which functioning section of the multiple functioning sections is to be used for each component; and the first lowering process of lowering the nozzle holder using any one of the multiple lifting and lowering sections that differs from the pre-assigned lifting and lowering section when the processing circuitry determines in the second determination process that the nozzle holder is not to be lowered by the pre-assigned lifting and lowering section.

6. The board work machine according to claim 5, wherein the processing circuitry executes:

in the second determination process, determining for each of the multiple lifting and lowering sections whether the multiple functioning sections are individually in the function state where the multiple functioning sections each function;

a notification process configured, when the second determination process is determined to be in the function state where the second determination process does not function, to notify that the second determination process is in the function state where the second determination process does not function; and a reception process configured to receive an input of the function state after the function state of the second determination process is notified of by the notification process.

7. The board work machine according to claim 5, wherein in the second determination process the processing circuitry determines for each of the multiple lifting and lowering sections whether the multiple functioning sections are individually in the function state where the multiple functioning sections function, wherein the processing circuitry updates the function state in the memory based on the function state determined by the second determination process.

8. The board work machine according to claim 5, wherein the side face imaging camera is configured to image a side face of the component picked up by the suction nozzle; and the touchdown sensor is configured to detect a push-in amount into a target board for the component picked up by the suction nozzle, the side face imaging camera captures an image for use in determining whether the component is picked up, and the touchdown sensor detects the push-in amount for use in determining whether the component is picked up.

9. The board work machine according to claim 1, wherein each of the multiple lifting and lowering sections includes a motor configured to rotate, a ball screw to convert a rotation of the motor to a linear motion, and a shaft lever that moves with the ball screw and presses the nozzle rotation shaft of the one of the nozzle holders.

* * * * *